United States Patent [19]

Nakamura

[11] Patent Number: 4,553,628

[45] Date of Patent: Nov. 19, 1985

[54] SPEAKER SYSTEM

[76] Inventor: Hisatsugu Nakamura, 13-3-1001 Roppongi, 5-chome, Minato-ku, Tokyo, Japan, 106

[21] Appl. No.: 523,454

[22] Filed: Aug. 15, 1983

[30] Foreign Application Priority Data

Oct. 18, 1982 [JP] Japan ............................... 57-182273

[51] Int. Cl.[4] ............................................. H05K 5/00

[52] U.S. Cl. .................................. 181/145; 181/156; 181/199

[58] Field of Search ............... 181/130, 131, 145, 152, 181/153, 156, 159, 182, 189, 190, 196, 197, 199; 179/119 R, 120, 115.5 H, 115.5 PS

[56] References Cited

U.S. PATENT DOCUMENTS

| | | | |
|---|---|---|---|
| 3,299,206 | 1/1967 | Klepper | 179/146 E |
| 3,944,757 | 3/1976 | Tsukamoto | 181/152 X |
| 4,146,744 | 3/1979 | Veranth | 181/156 X |

OTHER PUBLICATIONS

Klepper, "Constant Directional Characteristics From a Line Source Array"; The Journal of Audio Engineering Society, vol. 2, No. 3, Jul. 1963.

*Primary Examiner*—Russell E. Adams
*Assistant Examiner*—Brian W. Brown
*Attorney, Agent, or Firm*—K. H. Boswell; Edward D. O'Brian

[57] ABSTRACT

A speaker unit utilizing the sound radiation from the front and rear faces of a diaphragm can be constructed by placing the diaphragm in an acoustic baffle to isolate the back side and front side radiation and propogating the backside radiation through a tube to an acoustic resonator. This arrangement acoustically backloads the speaker and extends the frequency range over which piston-like motion of the diaphragm occurs without speaker breakup. A loudspeaker system producing good stereo image perception and suited for stereo sound reproduction for home or studio sound monitoring use can be constructed with a linear array of loudspeaker units. The sound radiation from the linear array is kept in phase over the audible range and through a wide angle about the axis of the array.

10 Claims, 5 Drawing Figures

SPEAKER SYSTEM

BACKGROUND OF THE INVENTION

The present invention relates to loudspeaker systems for high fidelity stereo sound reproduction.

It is a goal of high fidelity sound reproduction to faithfully reproduce and present to the listener the sounds of the original acoustic event with the proper phase relationships over the audible range.

Loudspeakers generally incorporate a vibrating diaphragm which is driven by an electronic signal to produce audible sound waves. This arrangement presents several problems. For high fidelity sound reproduction over the audible range a speaker diaphragm ideally moves in a piston-like motion where the entire surface vibrates in phase. To effectively radiate low frequencies a large speaker diaphragm excursion is generally required. This is usually achieved with a loudspeaker having a large diaphragm. Because of the large diaphragm such speakers are prone to speaker breakup at high frequency. Speaker breakup occurs when different portions of the diaphragm vibrate out of phase with the resulting sound also being out of phase.

Consequently many speaker systems employ a dual loudspeaker arrangement of large diaphragm "woofers" to transmit low frequency sound and small diaphragm "tweeters" to transmit high frequency sound. In some systems the transition range between low and high frequency sound is covered by additional mid range speakers. A switching network is required to prevent high frequency signals from reaching and breaking up the low frequency woofers.

Because of the poor response characteristics of each type of speaker over a portion of the audible range and the necessity of an electronic switching network to prevent speaker breakup, smooth frequency response over the full audible range is impaired.

The use of diaphragm loudspeakers creates sound radiation from both faces of the diaphragm. The sound radiation from the front of the diaphragm is 180° out of phase from that of the rear of the diaphragm. Unless these radiations are isolated, destructive interference and a decrease in speaker efficiency will result.

The simplest way of achieving this isolation is to place the speaker in an infinite baffle, i.e. a sheet of acoustically non-conducting material of sufficiently large dimensions to prevent radiation on one side of the baffle from reaching the other side. While in theory this works well, the large dimensions involved make it impractical for most applications. Attempts to approximate the effect of an infinite baffle include placing a speaker in an enclosure which exposes only the front face of the speaker to the external environment. The radiation from the rear of the diaphragm is confined to the enclosure. Because the enclosure possesses its own acoustic resonance and the radiation from the rear of the diaphragm is coupled to the speaker through the enclosure, the isolation of the front and rear radiation is degraded. This problem can be minimized by lining the box with sound absorbing material to absorb the radiation from the rear of the diaphragm. This solution is undesirable because it results in greatly lowered acoustic efficiency as the radiation of all frequencies from the rear of the diaphragm is lost.

This loss can be minimized if the radiation from the back side of the diaphragm is directed to the external environment in such a manner so as to be in phase with the sound radiation from the front of the diaphragm. This may be achieved by incorporating a port in the speaker enclosure and choosing the dimensions of the enclosure such that the port radiates sound in phase with the front side radiation from the diaphragm.

The prior art in the stereo sound reproduction field has established that an in phase, uniform and smooth frequency response over the range of audible frequencies is desirable for good stereo image perception. The desirability of retaining such in phase, uniform and smooth frequency response over a wide dispersion angle for good stereo image perception is also well established.

Multiple speaker systems are commonly used in stereo sound reproduction systems to achieve stereo image perception. Here the goal is to produce stereo image perception while minimizing directional dependence which might result in confusing sound images. For this purpose, it is desirable to have the acoustic energy dispersed in a vertical cylindrical wavefront if the loudspeaker system is in the center of the audience, or in a more common case, as a vertical hemicylindrical wavefront if the loudspeaker is mounted against a wall. This point is discussed in U.S. Pat. No. 3,668,335. Here the loudspeaker gives the acoustic appearance of a narrow vertical slot in a wall, radiating sound over a wide angle in the horizontal plane with minimal angular dependence of the sound intensity while minimizing sound transmission to, or reflection from horizontal surfaces such as the ceiling and floor.

One approach to this goal is shown in U.S. Pat. No. 3,668,335 and U.S. Pat. No. 3,980,829 which show the use of an acoustic lens. The lens is a rather large and complex structure and the speaker system does not utilize the backside radiation of the sound transducer. Linear arrays of loudspeakers have been used in several systems. U.S. Pat. No. 3,299,206 shows a linear array incorporating three different types of loudspeakers together with sound absorbing material to moderate the directivity of the output. This arrangement also does not use the backside output of the speakers. U.S. Pat. No. 4,267,405 shows a vertical column of loudspeakers including high and low frequency speaker assemblies. This system includes a filter network to separate high and low frequency output and prevent speaker breakup. Again, the backside output of the speakers is not used.

In view of the above, it is evident that there exists a need for a loudspeaker system having an increased acoustic efficiency, which utilizes the frontside and backside output of the diaphragm and which provides good stereo image perception. It is an object of this invention to provide a loudspeaker system with an increased acoustic efficiency. It is a further object to provide for increased acoustic efficiency by utilizing a plurality of small diameter speaker units, all of which are in phase. It is a further object to provide a loudspeaker system which provides an intense sound radiation output at the listening level so as to provide increased stereo image perception while preventing sound radiation upwardly or downwardly. A further object of this invention is to provide these features in a structure having a size which makes it practical for in home use. It is a further object of this invention to provide these features in a structure which is easily disassembled into smaller units for ease of transportation or shipping. It is a further object of this invention to provide a loudspeaker system having these features in a simple structure which can be constructed economically from readily available components.

SUMMARY OF THE INVENTION

These and other objects of the invention are met by providing a loudspeaker system comprising a loudspeaker means having a diaphragm means for radiating sound, said diaphragm means having front and rear faces; acoustic baffle means, said baffle means having an opening, said baffle means surrounding said rear face of said diaphragm and directing sound radiation from said rear face of said diaphragm and through said opening in said baffle means; a tube having first and second ends, said first end adjacent to said baffle means at said opening in said baffle means, to receive sound radiation propogated through said opening in said baffle means; acoustic resonator means for radiating sound, said resonator means having a resonator sound receiving opening and a resonator sound radiating opening, said resonator sound receiving opening adjacent to said second end of said tube to receive sound radiation propogate through said tube, said sound radiation being propogated from said acoustic resonator means through said resonator sound radiation opening.

Further, the objects of the invention are met by locating a plurality of small diameter speakers in close proximity in a vertical array. The back of the diaphragms of each of the speakers are enclosed and lead to a tube. The tubes for each of the individual speakers are substantially of the same dimensions. The end of each of the tubes not so connected to a speaker are connected to a common acoustical resonator means such that together, the tubes and the resonator means effectively absorb back radiated high frequency without disturbing the phase relationship among the individual speaker units. The acoustical resonator means includes an opening allowing for radiation of low frequency sound with the radiated low frequency sound augmenting the sound radiated from the front of the individual diahragms.

BRIEF DESCRIPTION OF THE DRAWINGS

This invention will be better understood when taken in conjunction with the drawings wherein.

Figure 1:
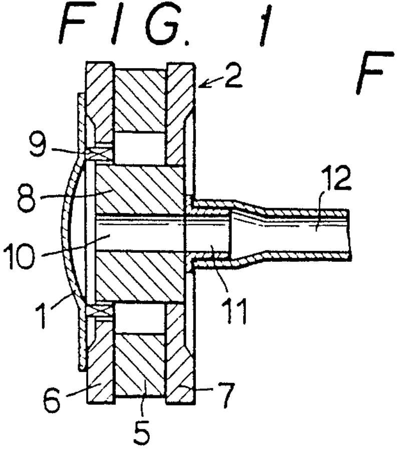
FIG. 1 is a side view in cross section of a speaker unit as disclosed in this specification.

The invention described in this specification and shown in the drawings attached hereto utilizes certain principles and/or concepts as are set forth in the claims appended to this specification. Those skilled in the acoustic arts will realize that these principles and/or concepts are capable of being utilized with a variety of embodiments different from the exact embodiment utilized for illustrative purposes herein. Consequently, this invention is not to be construed as being limited to the illustrative embodiments but is to be construed as being limited only by the scope of the claims appended hereto.

DETAILED DESCRIPTION OF THE INVENTION

FIG. 1 shows a side view in section of one speaker unit 2 utilized in this invention. The speaker unit 2 includes a domed diaphragm 1. The front of this diaphragm is towards the left hand side of FIG. 1 with the back side of the diaphragm towards the right hand side. As was noted previously, the sound radiated from the front side of any speaker would be 180 degrees out of phase from that radiating from the back side of the speaker.

Figure 2:
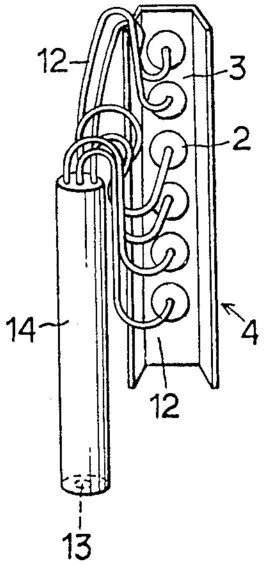
FIG. 2 is an elevational view of an array of the speaker of FIG. 1 including associated tubes and an accoustic resonating means.

In FIG. 2, a plurality of the speaker units 2 are shown in a support unit 3 such that they form a linear array 4. FIG. 2 shows the back side of each of the speaker units 2 as they are supported in the support unit 3.

For the linear array 4 shown in FIG. 2, the plurality of speaker units 2 would be arranged vertically such that they are essentially very close to one another. The linear distance between the top and the bottom most individual speaker units 2 in the linear array 4 is dependent upon certain frequency considerations as is discussed below. This consideration is based upon the low frequencies which are output by the speaker units 2.

Referring back to FIG. 1, it can be seen that the speaker units 2 include a permanent magnet 5 abutting against a pole piece 6. A yoke 7 also abutts against the permanent magnet 5. Within the central interior of the permanent magnet 5 is a central pole 8 which is in contact with the yoke 7 but is spaced away from the pole piece 6.

A voice coil 9 is located in the air gap between the central pole 8 and the pole piece 6. The voice coil 9 is appropriately attached to the diaphragm 1 in a usual manner by adhereing the same together with a suitable adhesive or the like. The air gap between the pole piece 6 and the central pole 8 in which the voice coil 9 resides is of a greater dimension than the voice coil so as to prevent air pressure buildup within the totality of the back side of the diaphragm 1.

The diaphragm 1 is attached about its perimeter to the pole piece 6. The diaphragm 1 is driven by the voice coil 9 in the usual manner upon passage of a suitable electrical signal through the voice coil 9 in a manner typical of construction of moving coil type speakers.

The central pole 8 includes a central pole hole 10 passing through its center which communicates with the back side of the diaphragm 1 directly at the dome portion of the diaphragm 1 and indirectly about the air gap surrounding the voice coil 9 to the periphery of the diaphragm 1. Sound pressure about the totality of the back side of the diaphragm 1 is therefore channeled to the central pole hole 10.

A flange tube 11 is attached to the cental pole 8 at the back side of the center pole hole 10 with the central opening of the flange tube 11 in direct communicatin with the central pole hole 10. This construction is the same for each of the individual speaker units 2 of the linear array 4.

Attaching to each of the flange tubes 11 are tubes 12. The tubes 12 thus receive the backwardly directed sound radiation from the moving piston diaphragm 1 in response to the electrical signals supplied to the voice coils 9.

Figure 3:
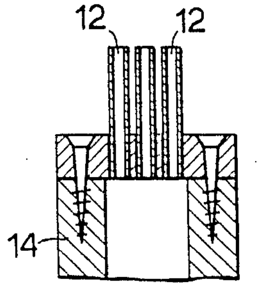
FIG. 3 is an elevational view in cross section of the top of the acoustic resonating means and the tubes adjacent thereto.

Referring again to FIG. 2 and further in conjunction with FIG. 3, the tubes 12 are led from the back side of each of the speaker units 2 to a resonance chamber 14. The resonance chamber 14 includes a chamber radiation opening 13 at one of its ends with the tubes 12 connecting to the other of its ends as is depicted in FIG. 3. The tubes 12 supply individual pathways between the interior of the resonance chamber 14 to the back side of each of the individual diaphragms 1 and the individual speaker units 2.

Figure 4:
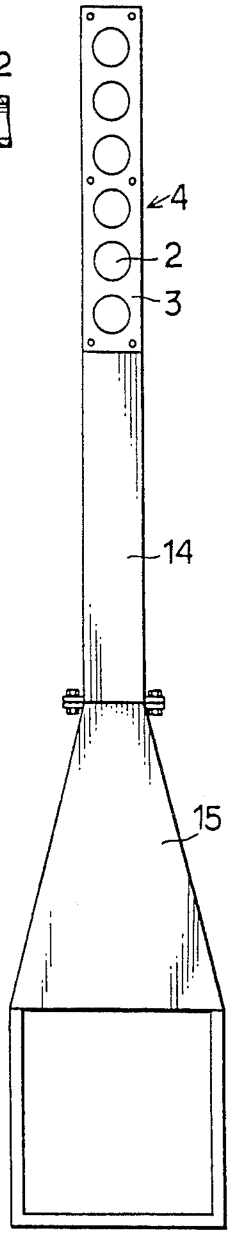
FIG. 4 is a front elevational view of an alternate embodiment of the loudspeaker system as disclosed in this specification.
Figure 5:
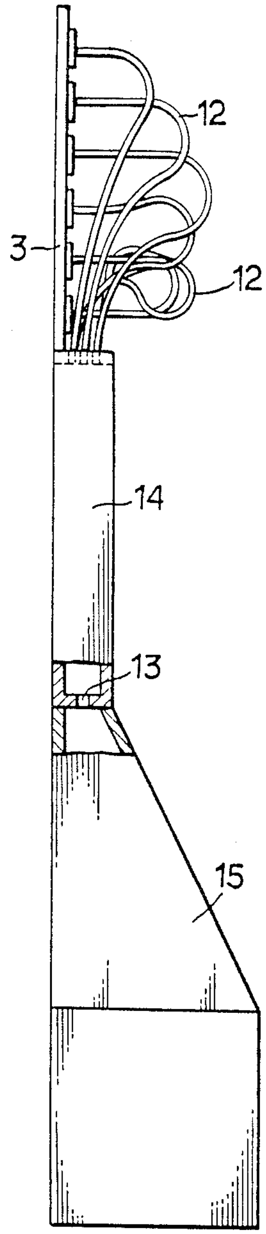
FIG. 5 is a side elevational view of FIG. 4 in partial section.

If desired, as seen in FIGS. 4 and 5, a low frequency acoustical horn 15 can be attached to the end of the resonance chamber 14 wherein the chamber radiation opening 13 is located. The horn 15 provides for more efficient back loading of the tubes 12 and the resonance chamber 14.

The back pressure of each of the speaker units 2 is relieved by the openings provided by the center pole hole 10, and the flange tube 11 leading into the tubes 12. Further, the openings within the tubes 12 freely communicate to the hollow interior of the resonance chamber 14 so as to transfer this back pressure to the resonance chamber 14.

If the effective diameter of the diaphragms 1 of each of the speaker units 2 is made smaller than the wave length of a typical top frequency of about 20,000 Hz the speaker efficiency will be decreased. The wave length of the 20,000 Hz sound radiation is 1.75 cm. If the diameter of the diaphragm 1 is made larger than 3.5 cm, which is two times the wave length of the 20,000 Hz, the directivity of the array will become too sharp in the horizontal plane, detracting from the sound quality thereof. As such, the optimum diameter for the diaphragms 1 is one to two times the wave length of the high frequency which is from about 1.75 cm to about 3.5 cm if 20,000 Hz is chosen as a cut off point for the highest frequency. As a practical working matter, a preferred range would be from about 2 cm to about 3 cm.

The tubes 12, the resonance chamber 14 and the acoustic horn 15, if used, form an acoustic baffle to impede destructive interference of the front side sound radiation of the diaphragm 1 by the back side sound radiation. Since the construction of the speaker units 2 as described above channels the totality of the back side radiation through the tubes 12, the components 12, 14, and 15 if used, can thus serve as this acoustical baffle.

The tubes 12 are formed of a suitable plastic having good acoustic properties such as those commonly used for ear phones and head sets typically found on airplanes and the like. The chamber 14 serves as a low pass filter preferentially radiating low frequency sounds which, because of their large wave length, have less directional characteristics than high frequency sounds. The back side high frequencies are absorbed without disturbing the phase relationship among the speaker units 2 in the array 4. Further, pressure relief and equalized back loading of each speaker unit 2 extends the low frequency range of the speaker units 2 and also prevents high frequency breakup of the speaker diaphragms.

The internal diameters of the tubes 12 are chosen in the preferred embodiment to be from about 2 mm to about 6 mm. If the internal diameter of the tubes 12 is essentially less than 2 mm, the frictional losses in the tubing will essentially increase, resulting in lower efficiency of the same. If the internal diameter is in excess of 6 mm, the efficiency will increase, but accompanying this increase will be an increase in the reactive component of the acoustical loading which will cause peaks and valleys in the frequency characteristics.

The length of the linear array 4 is governed by the number of speaker units 2 used. Generally, it is preferrable to locate the individual speaker units 2 closely adjacent to one another. As noted above, the dimensions of the speakers themselves, i.e. their diaphragm 1, is related to the wave length of the highest preferred frequency. The dimensions of the linear array 4 is related to the wave length at a typical low frequency such as 500 Hz. The wave length at 500 Hz is 6.8 cm. The preferred length of the linear array is from about 0.5 to 3 times the 500 Hz wave length which was noted to be 6.8 cm. Therefore, the preferred length of the array 4 would be from about 34 to 204 cm, with a length of 65 to 85 cm being the most practical.

The length of the individual tubes 12 should be consistent so as to equalize the back loading on each of the individual speaker units 2 and is also related to the length of the array 4. The length of the tubes 12 should be from about one end and one half times to four times the overall length of the array 4. For a 68 cm array discussed above, if the length of the tubing 12 is less than 68 cm, the reactive component of the acoustical loading will increase with detrimental effects on the frequncy characteristics on the sound. If the tubing is made excessively long, greater than the four fold length discussed above, frictional losses will increase and a loss in efficiency will result. If the length of the individual tubing to each of the speaker units 2 is not equalized, the phase relationship among the units will shift and the directional characteristics will change among the speaker units with resulting changes in frequency which will result in poor directional resolution.

I claim:

1. A speaker system comprising:

a plurality of speakers, each of said speakers having a diaphragm for radiating sound, each of said diaphragms having a front and a rear face;

a plurality of acoustical baffle means equal in number to the number of said speakers, each of said acoustic baffle means associated with the rear face of one of said speakers, each of said acoustic baffle means having an opening with said opening located in said acoustic baffle means so as to receive sound radiated from said rear face of its respective associated diaphragm;

a plurality of sound radiation conducting tubes, each of said tubes having a first end and a second end with a hollow interior extending between said ends, said plurality of tubes equal in number to the number of said speakers, each of said tubes associated with one of said acoustic baffle means by attaching said first end of said tube to said one of said acoustic baffle means at said opening in said acoustic baffle means and when so attached said tube receiving sound radiation propagated through said opening in said acoustic baffle means from said rear face in said diaphragm;

an acoustic resonator chamber for radiating sound, said acoustic resonator chamber having a receiving opening and a radiating opening, each of said second ends of said tubes attaching to said receiving opening so as to propagate sound radiation through said receiving opening to said resonator chamber, at least a portion of said sound radiation being further propagated from said resonator chamber through said radiating opening.

2. The speaker system of claim 1 wherein:

each of said plurality of said tubes are essentially the same length.

3. The speaker of claim 2 wherein;

said plurality of speakers are arranged in a vertically oriented linear array.

4. The speaker of claim 2 wherein:

said linear array has a length of from about 0.5 to about 3 times the wave length of the lowest frequency radiated by said speakers.

5. The speaker of claim 4 wherein:

said diaphragm of each of said speakers is from about 1 to about 2 times the wave length of the highest frequency emitted by said speakers.

6. The speaker of claim 5 wherein:

the hollow interior of each of said tubes has a diameter of from about 2 mm to about 6 mm.

7. The speaker of claim 6 wherein:

each of said tubes is of the same length as the other of said tubes and is of a length of from about 1.5 to about 4 times the length of said linear array of said speakers.

8. The speaker of claim 7 wherein:

said highest frequency emitted by said speakers is about 20,000 Hz and said lowest frequency emitted by said speakers is about 500 Hz and said linear array is from about 34 cm to about 204 cm in length.

9. The speaker of claim 8 further including:

acoustic horn means having a horn sound receiving opening and a horn sound radiating opening, said horn sound receiving opening in operative association with said acoustic resonator chamber radiating opening so as to receive sound propagated from said acoustic radiator means, said sound being further propagated from said acoustic horn means through said horn means sound radiating opening.

10. The speaker of claim 9 wherein:

said acoustic resonator chamber comprises a low pass filter.

* * * * *

UNITED STATES PATENT AND TRADEMARK OFFICE
CERTIFICATE OF CORRECTION

PATENT NO. : 4,553,628
DATED : NOVEMBER 19, 1985
INVENTOR(S) : HITSAGU NAKAMURA

It is certified that error appears in the above-identified patent and that said Letters Patent is hereby corrected as shown below:

CLAIM 4.

CHANGE THE DEPENDENCY OF CLAIM 4 FROM "CLAIM 2" TO --CLAIM 3--.

Signed and Sealed this

*Sixth* Day of *May 1986*

[SEAL]

*Attest:*

DONALD J. QUIGG

*Attesting Officer* *Commissioner of Patents and Trademarks*